(12) United States Patent
Yamamoto et al.

(10) Patent No.: US 6,831,278 B2
(45) Date of Patent: Dec. 14, 2004

(54) SYSTEM AND METHOD FOR ELECTRON BEAM IRRADIATION

(75) Inventors: Masanobu Yamamoto, Kanagawa (JP); Hiroshi Kawase, Kanagawa (JP); Jun Sasaki, Tokyo (JP); Minoru Takeda, Tokyo (JP); Gakuo Komatsubara, Tokyo (JP); Mitsuru Koizumi, Tokyo (JP); Setsuo Norioka, Tokyo (JP); Naoki Date, Tokyo (JP)

(73) Assignees: Sony Corporation, Tokyo (JP); JEOL Ltd., Tokyo (JP)

( * ) Notice: Subject to any disclaimer, the term of this patent is extended or adjusted under 35 U.S.C. 154(b) by 65 days.

(21) Appl. No.: 10/286,442

(22) Filed: Nov. 1, 2002

(65) Prior Publication Data

US 2003/0116718 A1 Jun. 26, 2003

(30) Foreign Application Priority Data

Nov. 2, 2001 (JP) ........................................ 2001-338267

(51) Int. Cl.[7] ................................................ H01J 37/20
(52) U.S. Cl. ............................. 250/441.11; 250/442.11
(58) Field of Search ........................... 250/310, 442.11, 250/397, 492.2

(56) References Cited

U.S. PATENT DOCUMENTS 4,087,729 A * 5/1978 Yamazaki et al. ............ 318/601
4,823,006 A * 4/1989 Danilatos et al. ............. 250/310
5,493,125 A 2/1996 Okayama et al.
5,734,164 A * 3/1998 Sanford ....................... 250/310
6,252,705 B1 * 6/2001 Lo et al. ...................... 359/393
6,259,960 B1 * 7/2001 Inokuchi ...................... 700/110

FOREIGN PATENT DOCUMENTS

JP           60089922           5/1985

* cited by examiner

Primary Examiner—John R Lee
Assistant Examiner—Johnnie L Smith, II
(74) Attorney, Agent, or Firm—Webb Ziesenheim Logsdon Orkin & Hanson, P.C.

(57) ABSTRACT

An electron beam irradiation system has a pumping block at an end of a microscope column of electron optics. The system has the rotary stage, the microscope column for directing an electron beam at the target on the rotary stage, the pumping block for evacuating air in the gap between the column and the target, a moving mechanism for sliding the rotary stage between a working position and a mounting position, and a cover member. In the working position, the target is opposite to the column. The cover member is brought into intimate contact with the rotary stage or target to prevent vacuum deterioration when the rotary stage moves from the working position to the mounting position.

6 Claims, 9 Drawing Sheets

SYSTEM AND METHOD FOR ELECTRON BEAM IRRADIATION

BACKGROUND OF THE INVENTION

1. Field of the Invention

The present invention relates to a system and method, such as an electron beam exposure system, for shooting an electron beam at a target, such as a master CD or master DVD (Digital Video Disc or Digital Versatile Disc) detachably held on a rotary stage.

2. Description of Related Art

In a conventional electron beam irradiation system, such as an electron beam exposure system, a target is placed within a vacuum chamber. Under this condition, an electron beam is directed at the target. Where the method involving placing the target within a vacuum chamber in this way is adopted, the structure for replacing the target within the vacuum chamber is complex. In addition, the operation to replace the target is cumbersome to perform.

An electron beam irradiation system fitted with a mechanism that achieves easy replacement of the target is described, for example, in Japanese Patent Laid-Open No. 89922/1985 (JP60089922). In this known system, the inside of the microscope column of electron optics is evacuated to permit an electron beam emitted from the microscope column to be directed at the target without being hindered by the atmosphere. A pumping block is mounted at the lower end of the column and used to evacuate the gap between the column and the target. With the system described in FIG. 3 of this laid-open patent publication, the portion of the target irradiated with an electron beam can be evacuated to a high vacuum of about $10^{-6}$ torr by drawing in the air from the gap. Furthermore, with the system illustrated in FIG. 4 of this laid-open patent publication, the gap can be evacuated to a vacuum of about $10^{-2}$ torr by making use of a negative pressure (Bernoulli Effect) created by air drawn out of the outer periphery of the gap.

With the aforementioned electron beam irradiation system, the target is detachably held on an XY stage. The position of the target is adjusted by driving the XY stage vertically and horizontally. When the target is mounted on or removed from the XY stage, it is driven to move the target into a position lying outside the pumping block of the microscope column of electron optics. At this time, one end of the XY stage is located immediately under the pumping block. This prevents the degree of vacuum from deteriorating. If the portion of the XY stage located immediately under the pumping block (i.e., the portion of the XY stage extending outwardly from the target) is too distant from the pumping block, the vacuum will deteriorate when the target is mounted or removed. If this occurs, it takes a long time to again sufficiently evacuate the inside of the microscope column containing the electron optics.

A target, such as a master CD or master DVD, that is a substantially circular storage medium is mounted on a rotary stage instead of the XY stage described above. In an electron beam irradiation system fitted with such a rotary stage, the target and rotary stage are conventionally placed within a vacuum chamber and a pumping block is not placed at the end of the microscope column.

An electron beam irradiation system fitted with the rotary stage and having the pumping block mounted at the end of the electron optical microscope column is discussed further below. The end portion of the stage on which the target is placed extends outwardly from the target to prevent vacuum deterioration as mentioned previously. Where the stage is an XY stage, if the end portion were at one end of the XY stage, then satisfactory results would arise. Where the stage is a rotary stage, the end portion needs to exist along the whole outer periphery of the rotary stage. This makes the whole rotary stage very bulky. Furthermore, where the end portion protruding out of the target is made larger to prevent vacuum deterioration more effectively, the rotary stage will be made very large. This, in turn, increases the driving force necessary to rotate the stage. Additionally, the rotation may not be stably controlled.

SUMMARY OF THE INVENTION

It is an object of the present invention to provide an electron beam irradiation system which is fitted with a rotary stage and has a pumping block placed at an end of a microscope column of electron optics, the system being characterized in that vacuum deterioration can be prevented during mounting and removal of a target without increasing the size of the rotary stage.

An electron beam irradiation system according to the present invention comprises: a rotary stage capable of detachably holding a target thereon; an electron optical microscope column for directing an electron beam at the target held on the rotary stage; a pumping block mounted at an end of the electron optical microscope column to evacuate air in the gap between the microscope column and the target; a moving mechanism for sliding the rotary stage relative to the microscope column radially of the rotary stage between a working position where the target held on the rotary stage is opposite to the microscope column and a mounting position where the target held on the rotary stage is spaced from the microscope column; and a cover member. When the rotary stage moves from the working position to the mounting position, the cover member is brought close to or into intimate contact with either a side surface of the rotary stage or a side surface of the target to prevent vacuum deterioration. When the rotary stage is in the mounting position, the cover member is opposite to the microscope column.

When the rotary stage rotates, a gap is formed between one of the side surface of the rotary stage and the side surface of the target on the rotary stage and the cover member. When the rotary stage moves from the working position to the mounting position, the cover member can move relative to the rotary stage or the target on the stage to thereby remove the gap.

When the electron beam is directed at the target held on the rotary stage from the electron optical microscope column, the pumping block evacuates the air in the gap between the microscope column and the target. The rotary stage is moved radially by the moving mechanism while rotating the stage when the microscope column is located opposite to the target. After irradiation, the target is replaced. At this time, the rotary stage is moved from the working position to the mounting position while continuing the pumping operation using the pumping block. In this mounting position, the target is replaced. The rotary stage is moved from the mounting position to the working position by the moving mechanism. During movement of the rotary stage between the working position and the mounting position, the microscope column is placed opposite to the target, rotary stage, or cover member. The stage is not exposed to the atmosphere and so vacuum deterioration can be prevented.

When the rotary stage turns, the cover member is moved away from the rotary stage or the target to form a gap between one of the side surface of the rotary stage and the side surface of the target and the cover member. During movement of the rotary stage between the working position and the mounting position, the cover member is moved toward the rotary stage or target, thus bringing the cover member into intimate contact with the side surface either of the rotary stage or of the target.

Other objects and features of the invention will appear in the course of the description thereof, which follows.

DESCRIPTION OF THE PREFERRED EMBODIMENTS

The preferred embodiments of the present invention are hereinafter described in detail with reference to the accompanying drawings.

First Embodiment

Figure 1:
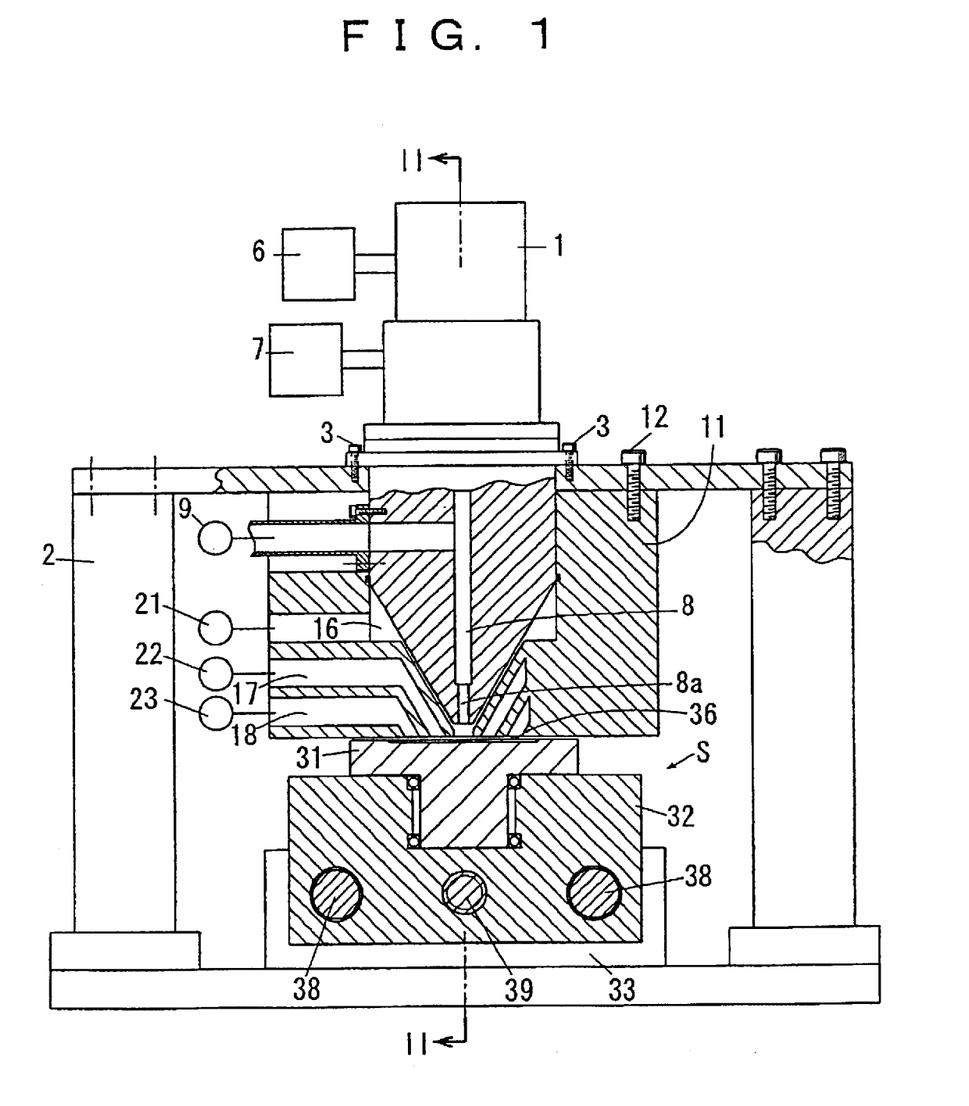
FIG. 1 is a partially cutaway front elevation of a first embodiment of the electron beam irradiation system of the present invention.
Figure 2:
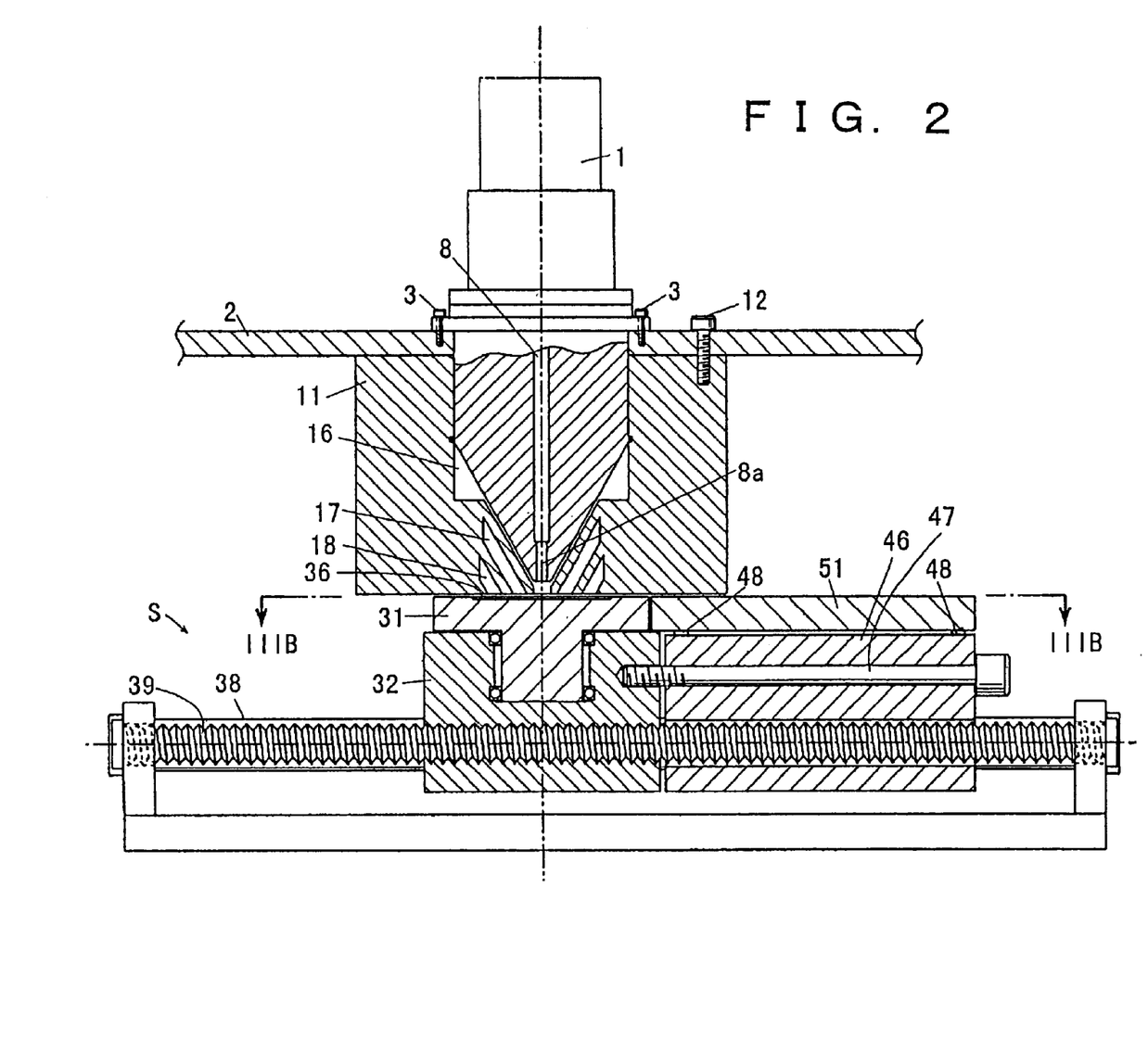
FIG. 2 is a cross-sectional view taken on line II—II of FIG. 1.
Figure 3A:
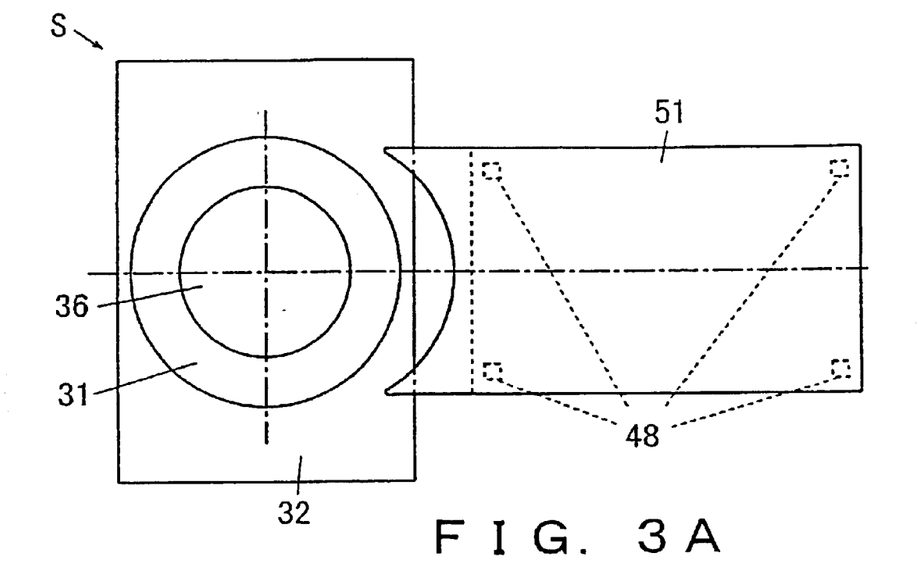
FIG. 3A is a plan view of a target, a rotary stage, a support stage, and an auxiliary stage shown in FIGS. 1 and 2, and in which the auxiliary stage is spaced from the rotary stage.
Figure 3B:
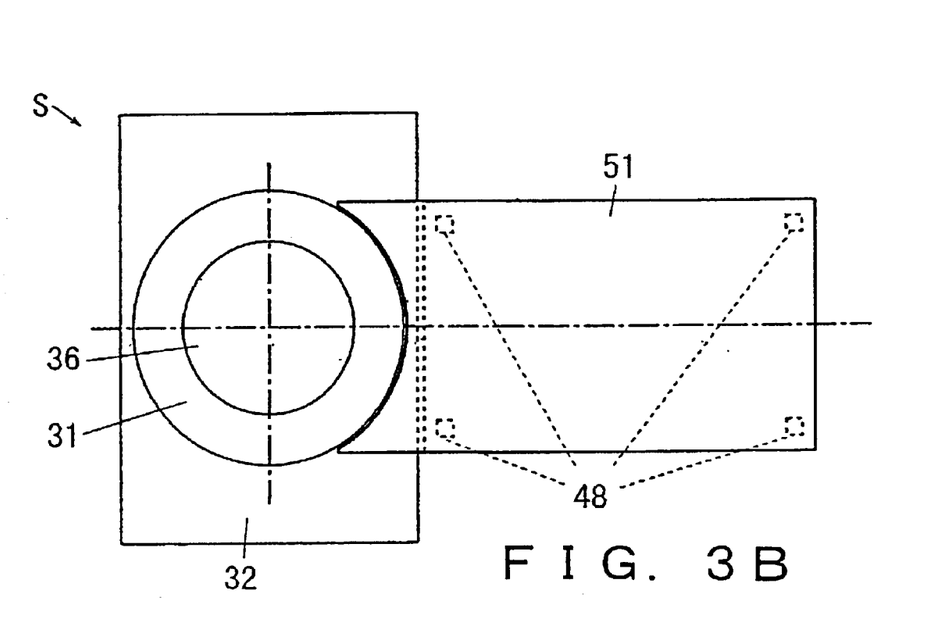
FIG. 3B is a plan view, partially in cross section, taken on line IIIB—IIIB of FIG. 2, and in which the auxiliary stage is in intimate contact with the rotary stage.

FIG. 1 is a partially cutaway front elevation of a first embodiment of the electron beam irradiation system of the present invention. FIG. 2 is a cross-sectional view taken on line II—II of FIG. 1. FIG. 3A is a plan view of a target, a rotary stage, a support stage, and an auxiliary stage shown in FIGS. 1 and 2, and in which the auxiliary stage is spaced from the rotary stage. FIG. 3B is a plan view, partially in cross section, taken on line IIIB—IIIB of FIG. 2, and in which the auxiliary stage is in intimate contact with the rotary stage.

The electron beam irradiation system has a microscope column 1 of electron optics incorporating a thermal field emission (TFE) gun therein. The microscope column 1 is fixedly mounted on the top of a pedestal 2 with screws 3. The space inside the column 1 is evacuated by sputter ion pumps 6 and 7. An electron beam from the electron gun passes through an electron beam passage 8 in the column 1 and is directed downward from the lower end of the column 1. A turbomolecular pump 9 is connected with the electron beam passage 8. This turbomolecular pump 9 and the pumps 6, 7 together cooperate to evacuate the air in the electron beam passage 8. An aperture 8a is mounted at the lower end of the electron beam passage 8. The pumping conductance is reduced using this aperture 8a.

A differential pumping block 11 is mounted on the pedestal 2 with screws 12 (only one is shown) at the lower end of the microscope column 1 of electron optics. This differential pumping block 11 has a high vacuum pumping chamber 16, a second rough pumping chamber 17, and a first rough pumping chamber 18. These pumping chambers are located around the lower end of the microscope column 1 of electron optics. Each of these pumping chambers 16–18 has a substantially annular open end. The open ends of these pumping chambers 16–18 are placed successively outward around the open end of the electron beam passage 8. A turbomolecular pump 21, a dry pump 22, and another dry pump 23 are connected with the high vacuum pumping chamber 16, second rough pumping chamber 17, and first rough pumping chamber 18, respectively. The electron beam passage 8 is at the lowest pressure (i.e., has the highest degree of vacuum). The pumping chamber 16, second rough pumping chamber 17, and first rough pumping chamber 18 are higher in pressure (i.e., lower in degree of vacuum) in this order.

A target stage assembly S is mounted below the microscope column 1 and differential pumping block 11 and spaced from them by a small distance of about 10 µm, for example. This target stage assembly S has a rotary stage 31, a support stage 32 rotatably holding the rotary stage 31, and a guide 33 for slidably guiding the support stage 32. The rotary stage 31 is substantially circular when viewed in a plane. The rotary stage 31 is rotationally driven by an electric motor (not shown) and has a substantially circular recess in its top surface. A target 36 is held in the recess formed in the rotary stage 31 such that the target can be mounted and removed by electrostatic attraction or vacuum attraction and that the outer surface of the target makes intimate contact with the inner surface of the recess. The top surface of the target 36 held in the recess formed in the rotary stage 31 is substantially flush with the top surface of the rotary stage 31.

The support stage 32 is slidably guided by a pair of guide rods 38 and by the guide 33 radially of the rotary stage 31, the guide rods 38 extending through the support stage 32. A drive screw 39 is screwed to the support stage 32 and extends therethrough. When the drive screw 39 is rotated by an electric motor (not shown), the support stage 32 is moved.

Referring to FIG. 2, an auxiliary mounting stage 46 is guided so as to be slidable relative to the guide rods 38 and guide 33. The auxiliary mounting stage 46 is provided with clearance over the drive screw 39 and can slide without being hindered by the drive screw 39. This mounting stage 46 is mounted to the support stage 32 such that its position can be adjusted by a position-adjusting threaded rod 47. Therefore, when the drive screw 39 rotates and the support stage 32 slides, the auxiliary mounting stage 46 slides together with the support stage 32. An auxiliary stage 51 acting as a cover member is mounted on the upper side of the auxiliary mounting stage 46 via a piezoelectric element 48 having a height-adjusting mechanism. The height of the top surface of the auxiliary stage 51 can be adjusted by applying a voltage to the piezoelectric element 48. The auxiliary stage 51 assumes an arc-shaped form (see FIGS. 3A and 3B) as viewed in a plane, the arc-shaped form having one end surface fitted over the rotary stage 31. The auxiliary stage 51 can be moved between a position where it is spaced from the side surface of the rotary stage 31 as shown in FIG. 3A and a position where the end surface of the auxiliary stage 51 is in intimate contact with the side surface of the rotary stage 31 as shown in FIG. 3B by rotating the position-adjusting threaded rod 47 to move the auxiliary mounting stage 46.

The thicknesses of pipes for connections of the pumps 6, 7, 9, 21, 22, and 23, their pumping speeds, and the conductances between the pumps are so set that the inside of the microscope column 1 of electron optics is held at about $5 \times 10^{-4}$ Pa (pascals) when the pumps 6, 7, 9, 21, 22, and 23 are driven provided that the gap between the target 36 on the rotary stage 31 and the differential pumping block 11 is about 10 $\mu$m.

The target that is substantially circular, such as a master CD or master DVD, is exposed by a method described below by the electron beam irradiation system constructed as described above.

As shown in FIGS. 1 and 2, it is first assumed that the center of the target 36 on the rotary stage 31 is opposite to an end portion of the microscope column 1 of electron optics. The position-adjusting threaded rod 47 is driven to move the auxiliary mounting stage 46, so that the auxiliary stage 51 is moved away from the rotary stage 31. Under this condition, the pumps 6, 7, 9, 21, 22, and 23 are driven to reduce the pressure between the target 36 on the rotary stage 31 and the microscope column 1. Then, an electron beam is appropriately directed from the electron gun of the microscope column 1. The drive screw 39 is rotated while rotating the rotary stage 31. Thus, the support stage 32 is moved at a constant speed. As a result, the surface of the target 36 is exposed vertically (spirally) by the electron beam.

On completion of the exposure, the target 36 is replaced. During this replacement, the drive screw 39 is driven to move the support stage 32 while maintaining the pumps 6, 7, 9, 21, 22, and 23 in operation. The target 36 is brought outside of the outer periphery of the differential pumping block 11. Prior to this movement, the position-adjusting threaded rod 47 is driven to move the auxiliary mounting stage 46 toward the support stage 32, thus bringing the auxiliary stage 51 in the state shown in FIG. 3A into intimate contact with the side surface of the rotary stage 31 as shown in FIG. 3B. The piezoelectric element 48 is also driven to adjust the height of the top surface of the auxiliary stage 51 to make the top surface of the auxiliary stage 51 substantially flush with the top surface of the target 36. In consequence, the vacuum inside the microscope column 1 is prevented from deteriorating.

Accordingly, whenever the target 36 moves (to the left as viewed in FIG. 2) from the working position where it is placed opposite to the microscope column 1 to the mounting position where the target is outside of the outer periphery of the differential pumping block 11 (i.e., spaced from the microscope column 1), any one of the target 36, rotary stage 31, and auxiliary stage 51 is located under the microscope column 1 and differential pumping block 11. Hence, deterioration of the vacuum inside the microscope column 1 can be minimized.

Since the current stability of the TFE emitter is dependent on the degree of vacuum inside the microscope column 1, the current stability of the electron beam in the microscope column 1 can be maintained by preventing deterioration of the vacuum inside the microscope column 1.

When the target 36 is in its mounting position, it is replaced by a new target 36. After the replacement, the drive screw 39 is driven to move the target 36, rotary stage 31, and support stage 32 from the mounting position to the working position. Then, the position-adjusting threaded rod 47 is rotated such that the auxiliary stage 51 does not impede rotation of the rotary stage 31. The auxiliary stage 51 is switched from the state in which it is in intimate contact with the rotary stage 31 shown in FIG. 3B to the state in which the auxiliary stage is spaced from the rotary stage 31 as shown in FIG. 3A. Thereafter, the newly installed target 36 is exposed by the electron beam.

In the first embodiment described above, the height of the top surface of the auxiliary stage 51 can be finely adjusted with the piezoelectric element 48. Consequently, vacuum deterioration can be prevented more efficiently by making the top surface of the auxiliary stage 51 substantially flush with the top surface of the target 36 and with the top surface of the rotary stage 31.

Second Embodiment

Figure 4:
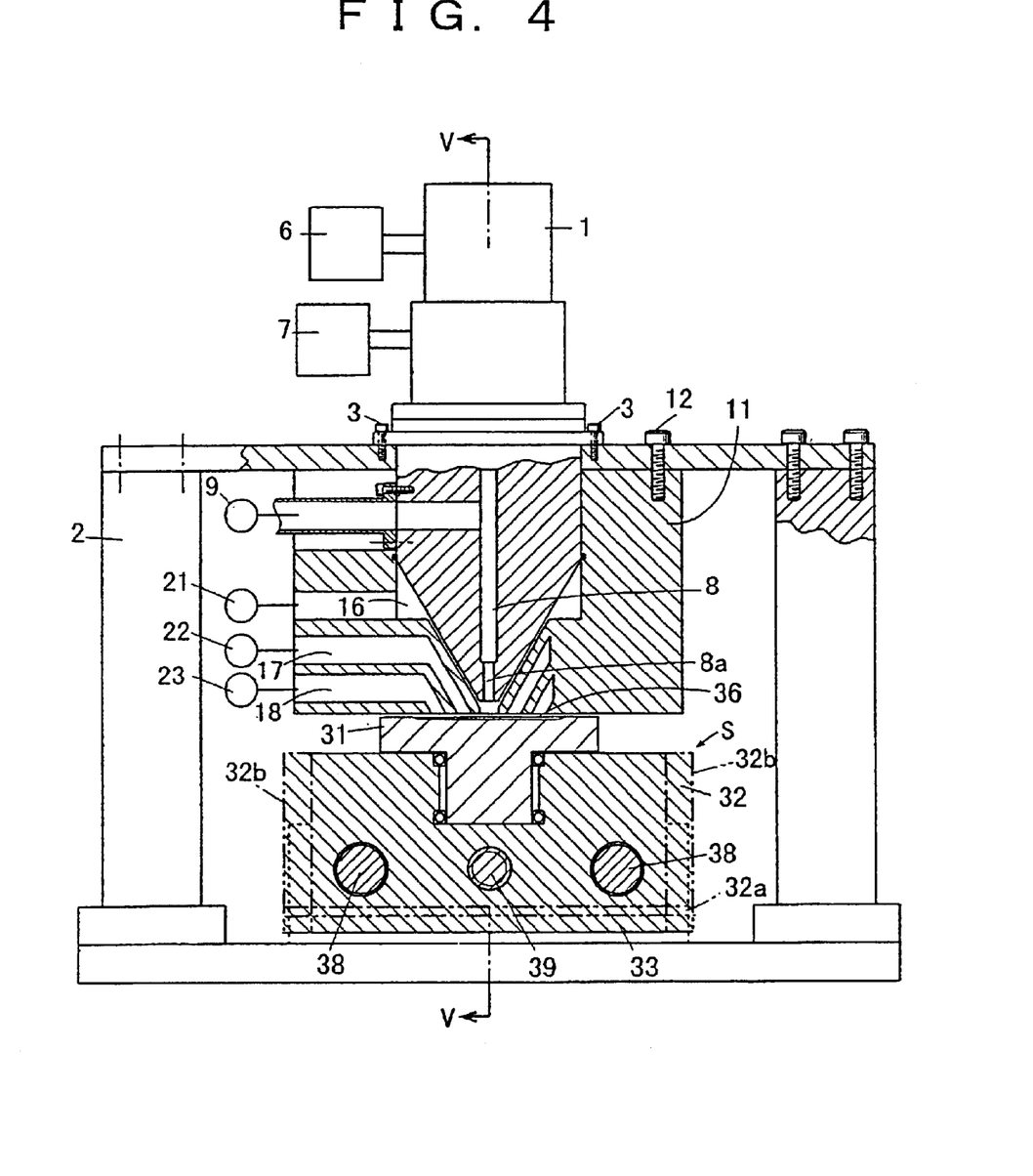
FIG. 4 is a partially cutaway front elevation similar to FIG. 1, but showing a second embodiment of the electron beam irradiation system of the present invention.
Figure 5:
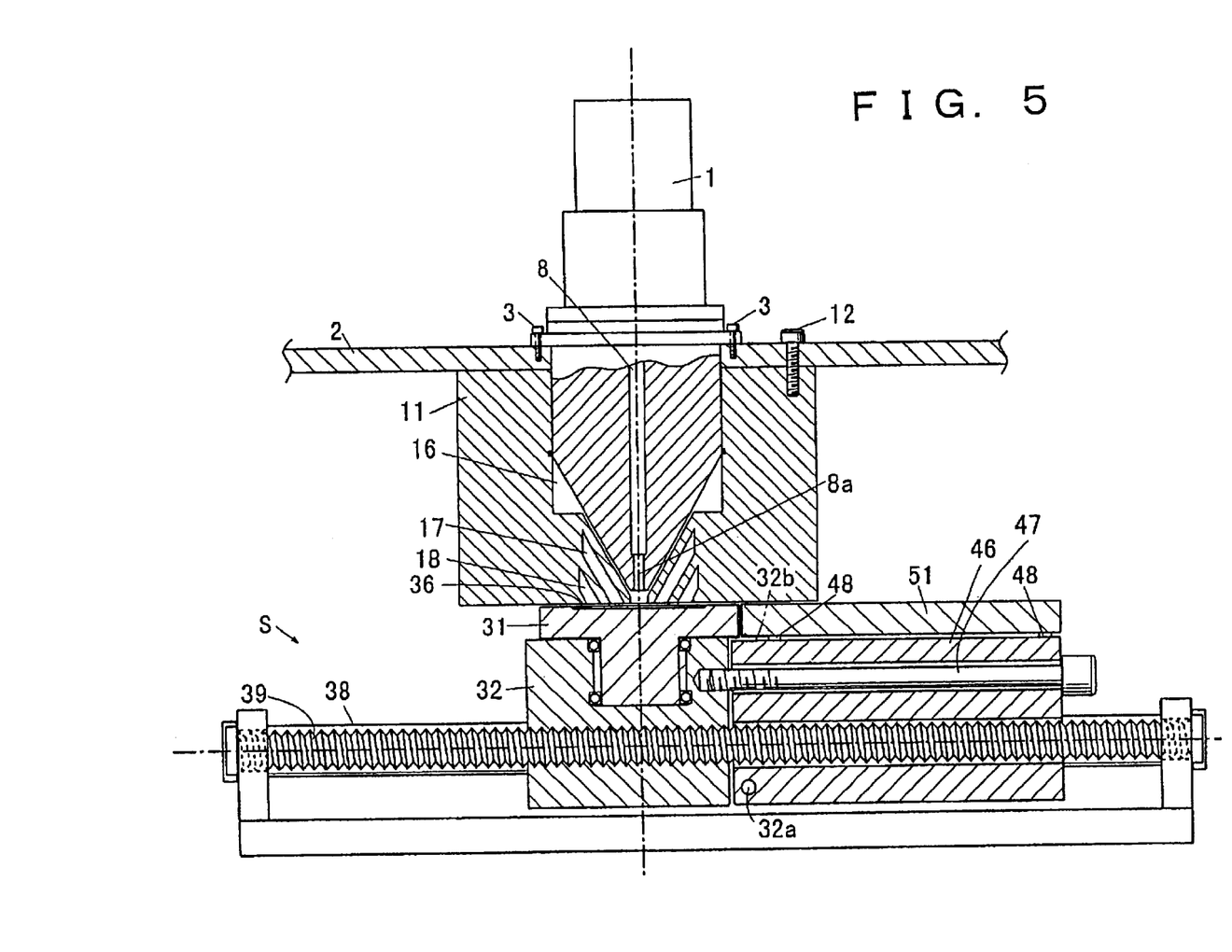
FIG. 5 is a cross-sectional view taken on line V—V of FIG. 4, and in which a position-adjusting threaded rod 47 has been tightened.
Figure 6:
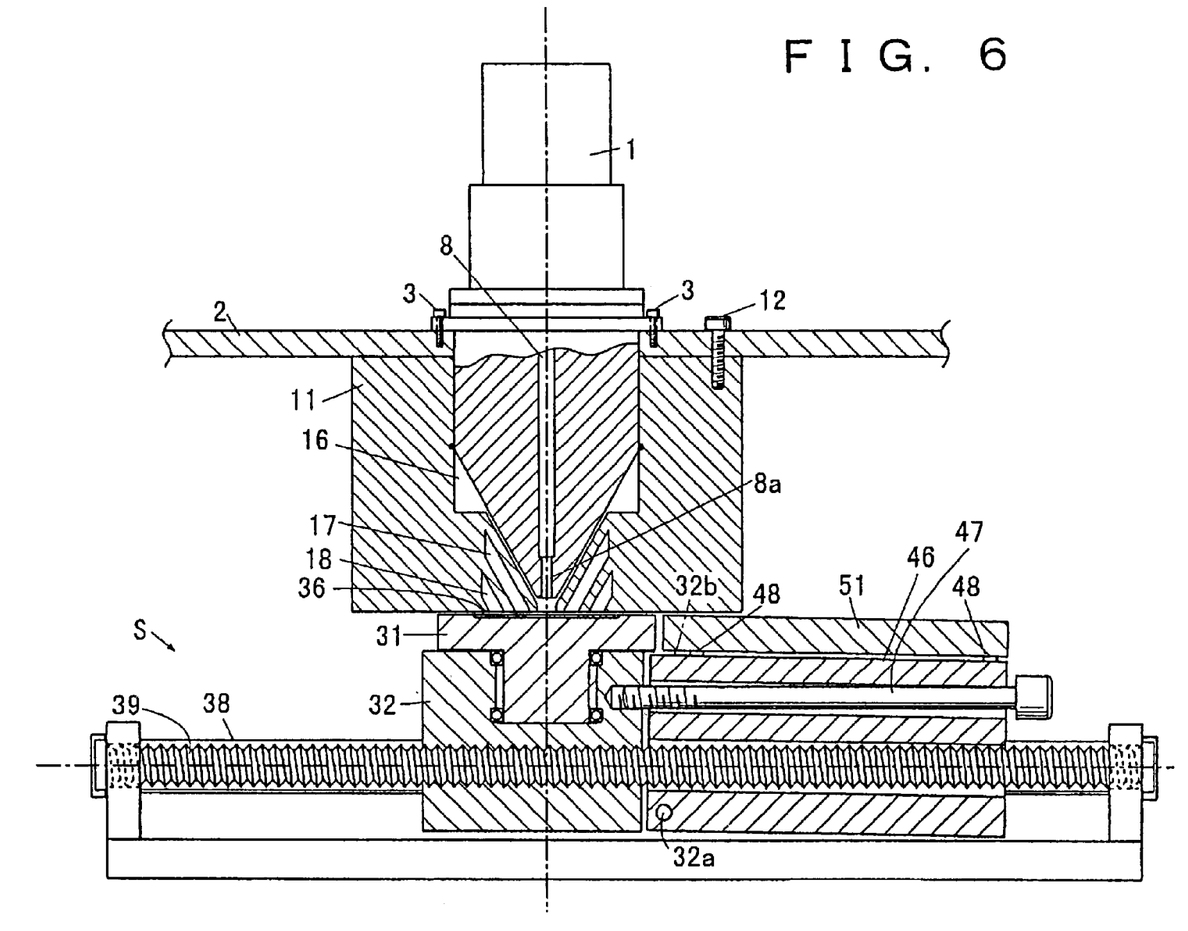
FIG. 6 is a view similar to FIG. 5, but in which the position-adjusting threaded rod 47 has been loosened.

FIG. 4 is a partially cutaway front elevation of the second embodiment of the electron beam irradiation system of the present invention and corresponds to FIG. 1 illustrating embodiment 1. FIG. 5 is a cross section taken on line V—V of FIG. 4, and in which the position-adjusting threaded rod 47 has been tightened. FIG. 6 shows a state in which the position-adjusting threaded rod 47 of FIG. 5 has been loosened.

It is to be noted that like components are indicated by like reference numerals in various figures and that those components which have been already described in the first embodiment will not be described in detail in the second embodiment.

Referring to FIGS. 4–6, a pair of shaft support portions 32b supports the shaft 32a of the support stage 32. The position-adjusting threaded rod 47 and a pair of guide rods 38 are loosely passed through the auxiliary mounting stage 46 of this second embodiment. The auxiliary mounting stage 46 is held to the shaft 32a so as to be swingable in a narrow angular range. The rotary shaft 32a is located under the portions of the rotary stage 31 and auxiliary stage 51 that are opposite to each other in FIGS. 5 and 6.

Accordingly, where the position-adjusting threaded rod 47 has been tightened, the auxiliary mounting stage 46 is held horizontally as shown in FIG. 5. The left end of the auxiliary stage 51 and the right end of the rotary stage 31 are kept in intimate contact with each other. However, when the threaded rod 47 has been loosened, the right-end side of the auxiliary mounting stage 46 tilts as shown in FIG. 6. The left end of the auxiliary stage 51 and the right end of the rotary stage 31 are spaced apart from each other. The rotary stage 31 is held in a state where it can rotate freely.

In this way, the top surface of the auxiliary stage 51 is made substantially flush with the top surface of the target 36 and with the top surface of the rotary stage 31 in the same way as in the first embodiment by tilting the auxiliary stage 51. Hence, vacuum deterioration can be prevented more efficiently.

Third Embodiment

Figure 7:
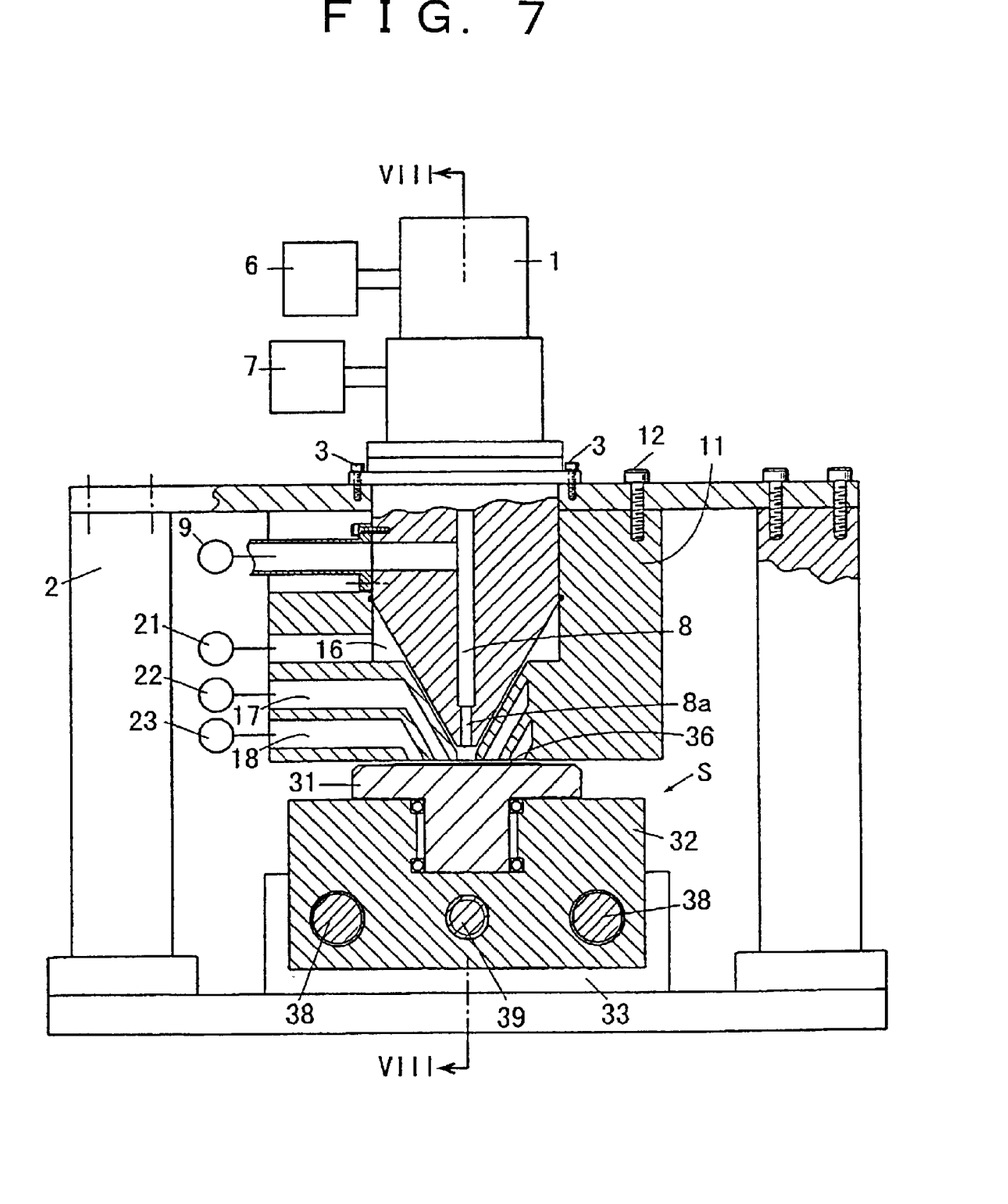
FIG. 7 is a partially cutaway front elevation of a third embodiment of the electron beam irradiation system of the present invention.
Figure 8:
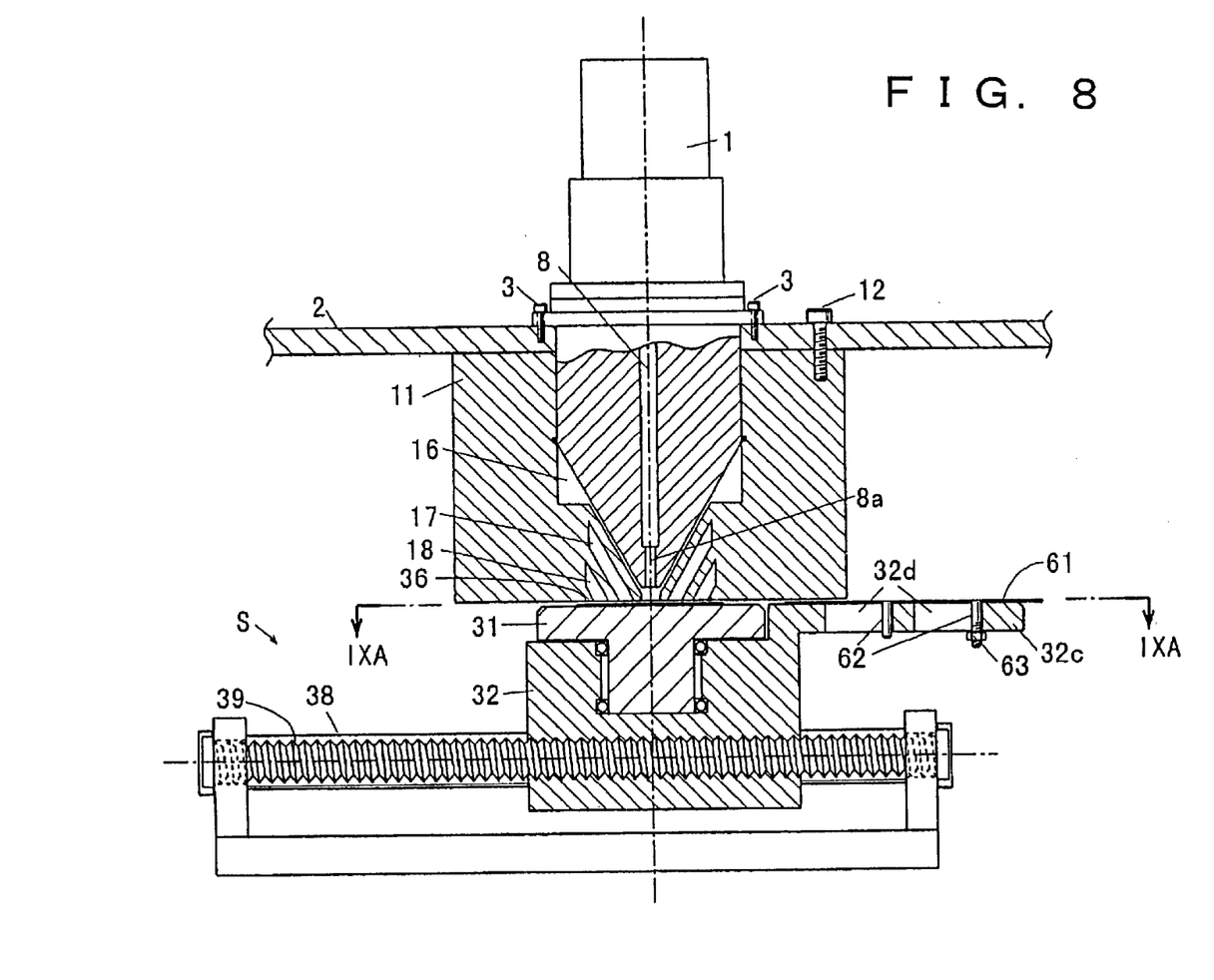
FIG. 8 is a cross-sectional view taken on line VIII—VIII of FIG. 7.
Figures 9, 9A:
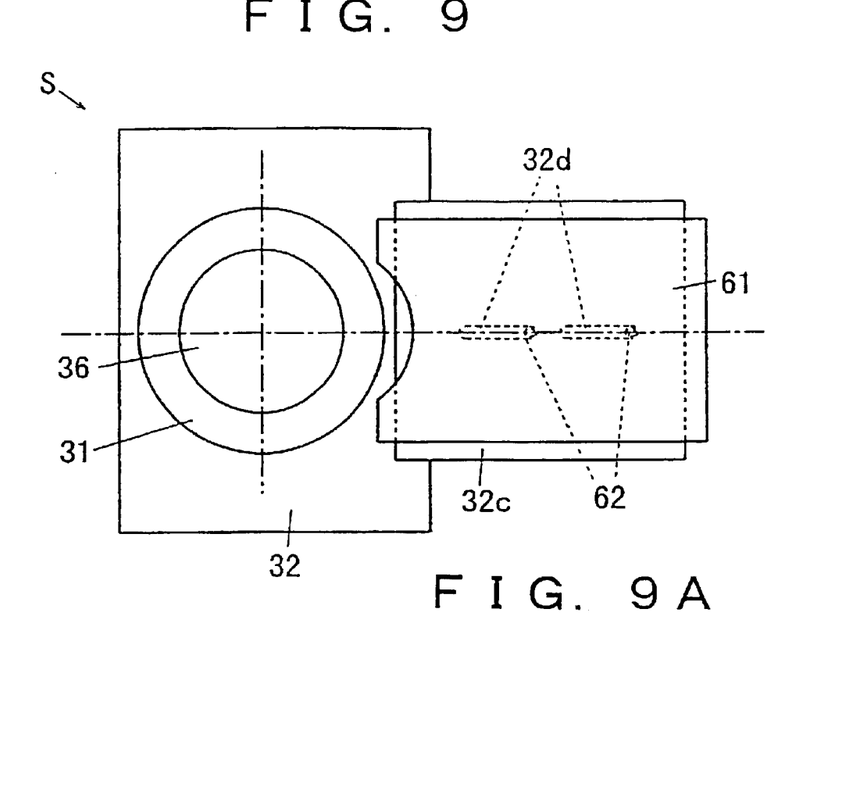
FIG. 9A is a plan view, partially in cross section, taken on line IXA—IXA of FIG. 8, showing a target, a rotary stage, a support stage, and an auxiliary stage shown in FIGS. 7 and 8, and in which the auxiliary stage is spaced from the target.
Figure 9B:
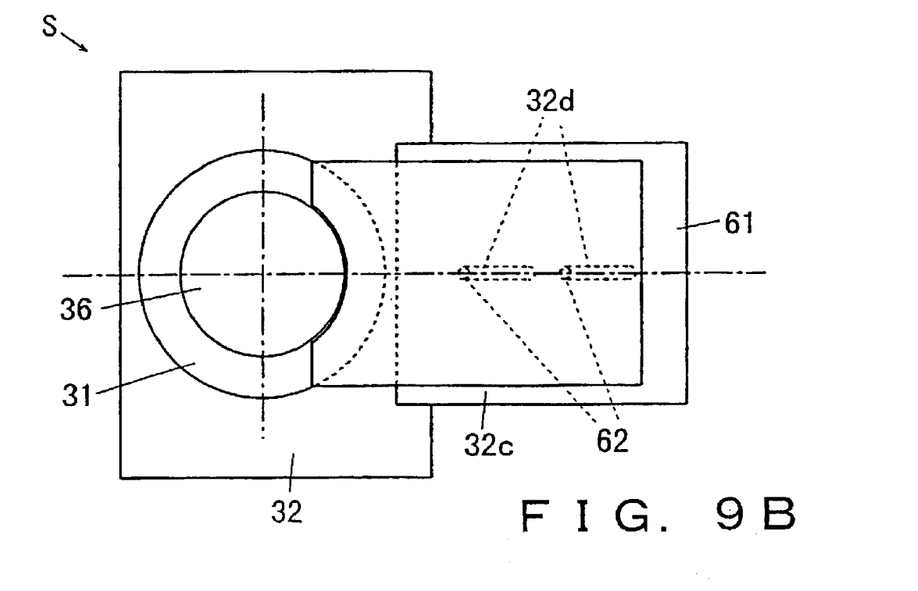
FIG. 9B is a view similar to FIG. 9A, but in which the auxiliary stage is in intimate contact with the target.

FIG. 7 is a partially cutaway front elevation of a third embodiment of the electron beam irradiation system of the present invention. FIG. 8 is a cross-sectional view taken on line VIII—VIII of FIG. 7. FIG. 9A is a plan view, partially in cross section, taken on line IXA—IXA of FIG. 8, showing the target, rotary stage, support stage, and auxiliary plate shown in FIGS. 7 and 8. In FIG. 9A, the auxiliary plate is spaced from the target. In FIG. 9B, the auxiliary plate is in intimate contact with the target. Those components which have been already described in the first embodiment are denoted by the same reference numerals as in the first embodiment and will not be described in detail below.

The third embodiment of the electron beam irradiation system has none of the auxiliary mounting stage 46, piezoelectric element 48, and auxiliary stage 51, unlike the first embodiment of the electron beam irradiation system. Furthermore, the rotary stage 31 of the third embodiment of the electron beam irradiation system is not provided with a recess, unlike the rotary stage 31 of the first embodiment. The top surface is flat. In addition, the support stage 32 of the third embodiment of the electron beam irradiation system has an extending top portion 32c that is substantially flush with the top surface of the rotary stage 31. The extending portion 32c is provided with a pair of slender slide holes 32d. An auxiliary plate 61 acting as a cover member is placed on the top surface of the extending portion 32c. This auxiliary plate 61 is substantially equal in thickness to the target 36. The top surface of the auxiliary plate 61 is almost flush with the top surface of the target 36. One end surface of the auxiliary plate 61 is shaped like an arc (see FIG. 9A) to be capable of making intimate contact with the outer surface of the target 36 on the rotary stage 31. Two slide pins 62 protrude downward from the auxiliary plate 61 and are slidably fitted in the slide holes 32d, respectively, in the support stage 32. A nut 63 is screwed to one slide pin 62. The position of the auxiliary plate 61 can be fixed by tightening the nut 63. When the nut 63 is loosened, the auxiliary plate 61 is slidable radially of the rotary stage 31. The auxiliary plate 61 can be moved between a position where it is spaced from the side surface of the target 36 shown in FIG. 9A and another position where it is in intimate contact with the side surface of the target 36 shown in FIG. 9B.

A method of exposing the target 36, such as a nearly circular master CD or master DVD, by the third embodiment of the electron beam irradiation system constructed in this way is described below.

As shown in FIGS. 7 and 8, it is first assumed that the center of the target 36 on the rotary stage 31 is opposite to an end portion of the microscope column 1 of electron optics. Under this condition, the pumps 6, 7, 9, 21, 22, and 23 are driven to reduce the pressure between the target 36 on the rotary stage 31 and the microscope column 1 in the same way as in the first embodiment. Then, an electron beam is appropriately directed from the electron gun of the microscope column 1. The drive screw 39 is rotated while rotating the rotary stage 31. Thus, the support stage 32 is moved at a constant speed. As a result, the surface of the target 36 is exposed vortically (spirally) by the electron beam.

On completion of the exposure, the target 36 is replaced. During this replacement, the drive screw 39 is driven to move the support stage 32 while maintaining the pumps 6, 7, 9, 21, 22, and 23 in operation. The target 36 is brought outside of the outer periphery of the differential pumping block 11. Prior to this movement, the nut 63 is loosened to move the auxiliary plate 61 from the position shown in FIG. 9A toward the target 36 into a position (FIG. 9B) where it is in intimate contact with the side surface of the target 36. When the end surface of the auxiliary plate 61 comes into intimate contact with the side surface of the target 36, the nut 63 is loosened and the position of the auxiliary plate 61 is fixed. Accordingly, when the target 36 moves from the working position where it is opposite to the microscope column 1 of electron optics to the mounting position that is located outside the outer periphery of the differential pumping block 11 and thus is spaced from the microscope column 1, either the target 36 or auxiliary plate 61 is always present under the microscope column 1 and pumping block 11. Deterioration of the vacuum inside the microscope column 1 can be minimized.

When the target 36 is in the mounting position, it is replaced by a new target 36. After the replacement, the drive screw 39 is driven to move the target 36, rotary stage 31, and support stage 32 from the mounting position to the working position. Then, the auxiliary plate 61 in intimate contact with the target 36 as shown in FIG. 9B is brought into a position where the plate is spaced from the target 36 as shown in FIG. 9A. Thereafter, the newly mounted target 36 is exposed.

In the above third embodiment, the auxiliary plate 61 can make intimate contact with the side surface of the target 36. Therefore, if the top surface of the target 36 is not flush with the top surface of the rotary stage 31, vacuum deterioration can be prevented efficiently.

While the preferred embodiments of the present invention have been described in detail, the invention is not limited thereto. Rather, various changes and modifications are possible within the scope of the invention delineated by the appended claims. Modified embodiments of the invention are given below.

(1) Although the electron beam irradiation systems of the embodiments disclosed herein are exposure tools, they can be used in applications other than exposure.

(2) In the above embodiments, the mechanism for moving the rotary stage includes the drive screw 39 and guide rod 38. The moving mechanism may be designed differently. Furthermore, the rotary stage may be moved relative to the microscope column of electron optics by moving the microscope column and the pumping block while fixing the position of the rotary stage.

(3) The first embodiment has assumed that the top surface of the rotary stage 31 is larger in diameter than the target 36. The diameter of the top surface of the rotary stage 31 may be set equal to or less than the diameter of the target 36, and the cover member 51 may be brought into intimate contact with the side surface of the target 36.

(4) With respect to a cover member such as the auxiliary stage 51 or auxiliary plate 61, it is desired that its end surface can be brought into intimate contact with the side surface of the target. However, complete intimate contact is not essential. It is also possible to bring the end surface close to the side surface.

(5) The structure for moving the auxiliary stage 51 or auxiliary plate 61 is not limited to the structure described in each embodiment above. The moving structure may be appropriately modified.

(6) The mechanism for adjusting the height of the auxiliary stage 51 that is a cover member may be built using a material other than the piezoelectric element 48.

(7) Focusing may be previously done over a cover member.

According to the present invention, if the rotary stage moves between the working position and the mounting position for the target, the inside of the microscope column of electron optics is not exposed to the atmosphere because the target, rotary stage, or cover member is kept opposite to the microscope column. Consequently, vacuum deterioration can be prevented. Furthermore, the provision of a cover member makes it possible to reduce the diameter of the rotary stage. Therefore, the driving force necessary to rotate the rotary stage can be reduced. In addition, control of rotation of the rotary stage can be prevented from becoming unstable.

Since the cover member can move relative to either the rotary stage or the target on it, a gap is formed between the side surface of the rotary stage or target and the cover member during rotation of the cover member. This can prevent the cover member from impeding rotation of the rotary stage or target. When the rotary stage moves between the working position and mounting position for the target, the cover member is brought into intimate contact with the side surface either of the rotary stage or of the target, thus removing the gap between the cover member and the rotary stage or target. In consequence, deterioration of the vacuum inside the microscope column of electron optics can be prevented efficiently.

Having thus described our invention with the detail and particularity required by the Patent Laws, what is desired protected by Letters Patent is set forth in the following claims.

The invention claimed is:

1. An electron beam irradiation system comprising:
   a rotary stage capable of detachably holding a target thereon;
   an electron optical microscope column for directing an electron beam at said target held on said rotary stage on an axis substantially normal to the target;
   a pumping block mounted at an end of said microscope column to evacuate air in a gap between said microscope column and said target;
   a moving mechanism for sliding said rotary stage relative to said microscope column radially of said rotary stage between a working position where said target held on said rotary stage is opposite to said microscope column and a mounting position where said target held on said rotary stage is spaced from said microscope column; and
   a cover member which, when said rotary stage moves from said working position to said mounting position, is brought close to or into intimate contact with one of a side surface of said rotary stage or a side surface of said target to prevent vacuum deterioration and which, when said rotary stage is in said mounting position, is opposite to said microscope column and the height of the top surface of which is substantially flush with that of the top surface of said target.

2. An electron beam irradiation system as set forth in claim 1, wherein when said rotary stage rotates, a gap is formed between one of the side surface of said rotary stage or the side surface of said target on said rotary stage and said cover member, and wherein when said rotary stage moves from the working position to the mounting position for said rotary stage, said cover member can move relative to said rotary stage or said target on the rotary stage to remove said gap.

3. An electron beam irradiation system comprising:
   a rotary stage capable of detachably holding a target thereon;
   an electron optical microscope column for directing an electron beam at said target held on said rotary stage;
   means mounted at an end of said microscope column for evacuating air in a gap between said microscope column and said target;
   means for sliding said rotary stage relative to said microscope column radially of said rotary stage between a working position where said target held on said rotary stage is opposite to said microscope column and a mounting position where said target held on said rotary stage is spaced from said microscope column; and
   cover means for, when said rotary stage moves from said working position to said mounting position, being brought close to or into contact with one of a side surface of said rotary stage or a side surface of said target preventing vacuum deterioration and which, when said rotary stage is in said mounting position, being opposite to said microscope column.

4. An electron beam irradiation system as set forth in claim 1, wherein when said rotary stage rotates, a gap is formed between one of the side surface of said rotary stage or the side surface of said target on said rotary stage and said cover means, and wherein when said rotary stage moves from the working position to the mounting position for said rotary stage, said cover means can move relative to said rotary stage or said target on the rotary stage to remove said gap.

5. A method of directing an electron beam at a target by the use of an electron beam irradiation system having a rotary stage that rotates on an axis substantially normal to the surface of the target and capable of detachably holding the target thereon, an electron optical microscope column for shooting the electron beam at said target held on said rotary stage, a pumping block mounted at an end of said microscope column to evacuate air in a gap between said microscope column and said target, and a moving mechanism for sliding said rotary stage relative to said microscope column radially of said rotary stage between a working position where said target held on said rotary stage is opposite to said microscope column and a mounting position where said target held on said rotary stage is spaced from said microscope column, said method comprising the step of:
   placing a cover member close to or into intimate contact with one of a side surface of said rotary stage or a side surface of said target on said rotary stage so as to make the height of the ton surface of said cover member substantially flush with that of the ton surface of said target to prevent vacuum deterioration when said rotary stage moves from said working position to said mounting position.

6. A method of shooting an electron beam as set forth in claim 5, wherein a gap is formed between one of the side surface of said rotary stage or the side surface of said target on said target and said cover member when said rotary stage rotates, and wherein said cover member is brought close to or into intimate contact with said rotary stage or said target on said rotary stage when said rotary stage moves from said working position to said mounting position to remove said gap.

* * * * *

UNITED STATES PATENT AND TRADEMARK OFFICE
CERTIFICATE OF CORRECTION

PATENT NO.   : 6,831,278 B2
DATED        : December 14, 2004
INVENTOR(S)  : Yamamoto et al.

It is certified that error appears in the above-identified patent and that said Letters Patent is hereby corrected as shown below:

Column 10,
Lines 44 and 45, "the ton surface" should read -- the top surface --

Signed and Sealed this

Thirty-first Day of May, 2005

JON W. DUDAS
*Director of the United States Patent and Trademark Office*